(12) United States Patent
Liu

(10) Patent No.: US 6,602,641 B1
(45) Date of Patent: Aug. 5, 2003

(54) WAFER'S ZERO-LAYER AND ALIGNMENT MARK PRINT WITHOUT MASK WHEN USING SCANNER

(75) Inventor: Kun Yi Liu, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 8 days.

(21) Appl. No.: 09/837,598

(22) Filed: Apr. 19, 2001

(51) Int. Cl.[7] ............................. G03F 9/00; G03C 5/00
(52) U.S. Cl. .............................. 430/5; 430/22; 430/30
(58) Field of Search ................................. 430/5, 22, 30

(56) References Cited

U.S. PATENT DOCUMENTS

| | | | |
|---|---|---|---|
| 5,837,404 A | 11/1998 | Lu | 430/5 |
| 5,893,744 A | 4/1999 | Wang | 438/401 |
| 5,902,452 A | 5/1999 | Cheng et al. | 156/657 |
| 6,083,650 A | 7/2000 | Ogusu et al. | 430/22 |

*Primary Examiner*—Christopher G. Young
(74) *Attorney, Agent, or Firm*—George O. Saile; Stephen B. Ackerman

(57) ABSTRACT

A new method is provided for the use of alignment marks. In prior art methods, a combination mask is mounted in a mask holder. The combination mask contains multiple, different alignment marks for different purposes and steps in a semiconductor processing sequence. This mark is printed onto the surface of a wafer. Using the method of the invention, a reticle is used that does not contain any patterns (a zero-layer reticle), on this zero-layer reticle an alignment mark is created. This zero-layer alignment mark is referred to as the zero-mark alignment mark, this alignment mark can be printed directly onto the wafer surface. Under the invention, the zero-layer reticle takes the place of the prior art mask holder, on the zero-layer reticle an alignment mark is created that can be directly printed from the zero-layer reticle onto the surface of a wafer. The zero-layer reticle further contains a multiplicity of production alignment marks in a location that is fixed with respect to the alignment mark. The location of the alignment marks therefore corresponds to a location of each alignment mark that belongs to the multiplicity of production alignment marks.

8 Claims, 1 Drawing Sheet

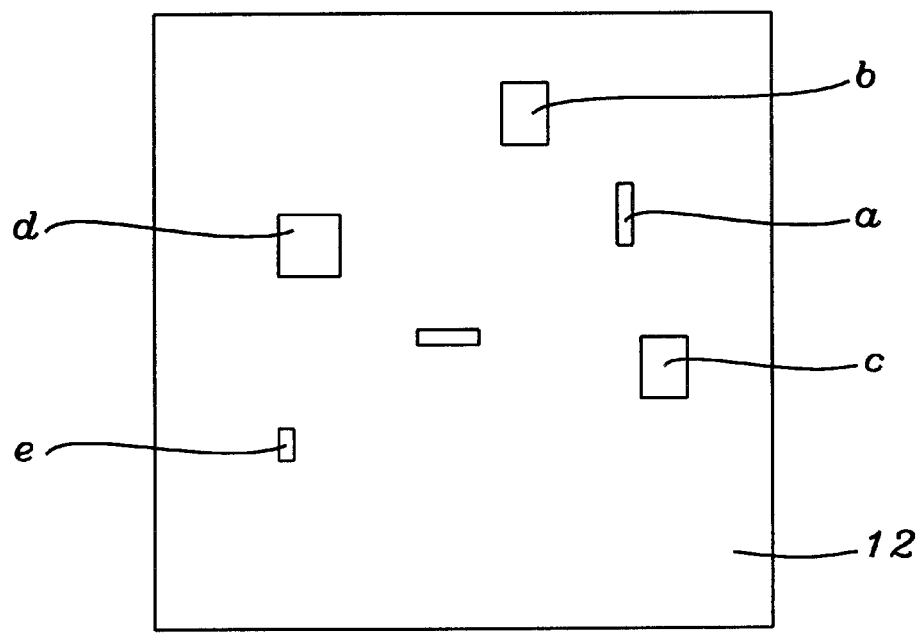
FIG. 1 - Prior Art
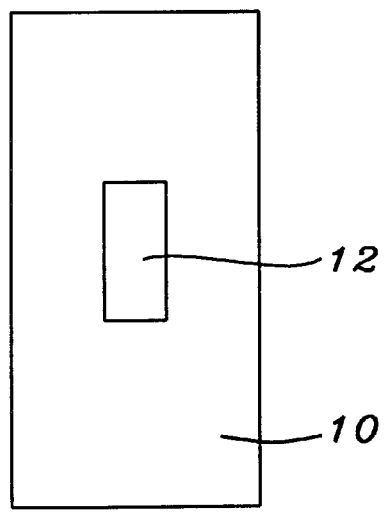
FIG. 2 - Prior Art
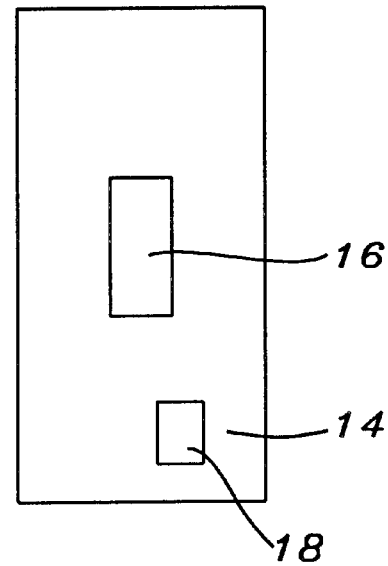
FIG. 3

WAFER'S ZERO-LAYER AND ALIGNMENT MARK PRINT WITHOUT MASK WHEN USING SCANNER

BACKGROUND OF THE INVENTION (1) Field of the Invention

The invention relates to the fabrication of integrated circuit devices, and more particularly, to a method of creating an alignment mark that is used to align wafers.

(2) Description of the Prior Art

During the process of creating semiconductor devices, many interacting technologies are applied that collectively lead to devices of various complexity. In many of the processing steps that are used for the creation of a semiconductor device, masks are used to expose patterns on a semiconductor surface. In the creation of overlying patterns it is of extreme importance that not only the resolution for the creation of a pattern is optimized but that, in addition, overlay accuracy is tightly controlled. Overlay inaccuracy can be introduced during the alignment of an exposure mask and during the subsequent exposure process. The literature of the art offers numerous and excellent documentation relating to wafer exposure, the methods used, sources of error that can be introduced for each of the methods used and the like. In view of the ready availability of such documentation, only a summary overview will be presented here while further detailed insight can readily be gained from the available literature. The below referenced and related patents offer a good starting point for further reference, this starting point provides adequate material for further detail on the subject of wafer overlay accuracy.

One of the sources of reference on the subject of overlay accuracy is the textbook ULSI Technology by Chang and Sze, which is a well-known reference book in the art. Chang and Sze offer an overview of overlay accuracy, section 6.2.4, page 288 of the referenced volume. Chang and Sze provide detail regarding methods of alignment (off-axis and through-the-lens or TTL), advantages of the off-axis method (using nonactinic rays and broad-band and high NA viewing with the therefrom following brightfield, darkfield or phase-contrast viewing, easy upgrading of the system), disadvantages of the off-axis system (requiring high mechanical stability and accurate means to refer the positions of the interacting components of mask, wafer and the alignment microscope) in addition to advantages and disadvantages for the TTL system.

It is clear from the above that, for the manufacturing of semiconductor devices, it is critically important that multiple layers of exposure are created such that these layers closely align with each other. Any deviation from this close alignment will result in either faulty or in marginally operational devices. While some overlay errors may be allowed, the continual striving in creating overlying patterns is to make this overlay error as small as possible with the ultimate objective of completely eliminating all overlay errors. For many of the pattern creation activities, a masking system is used whereby a pattern is placed on a reticle. It is at this time of value to reiterate the meaning of the concept of mask and reticle: a mask is a patterning tool that contains a pattern that must be created over an entire surface of a wafer in one exposure, a reticle is a pattern creation tool that contains pattern images that must be stepped and repeated in order to expose an entire surface of a wafer. For overlying layers that are created in or on a semiconductor surface, successive masks are aligned by using alignment marks on each of the masks that is used for the various layers and aligning these alignment marks with the mark or marking pattern of the reticle. This approach assures that each successive layer can be deposited with extreme accuracy and closely aligned with preceding patterns that have been created on the semiconductor surface.

Wafer stepper tools have long been used for the purpose of exposing patterns in a step-and-repeat pattern by imaging several successive exposures of portions of a wafer surface and, in this manner, to cover the entire wafer surface. Wafer stepper tools typically align using an exposure mask with respect to a wafer. The wafer stepper tool uses an image, that is observed and transmitted by a camera, projects the image onto the reticle from where the image gets imprinted onto the surface of a photo sensitive layer such as photoresist. The camera typically, for increased accuracy, magnifies the observed image (by a factor of 5). The position of the reticle with respect to the semiconductor surface that must be exposed is controlled by alignment marks on the surface of the wafer, these alignment marks are used to accurately position the reticle with respect to the semiconductor surface.

For high speed, automated semiconductor manufacturing facilities, the alignment of wafers within wafer stepping tools is accomplished by optical means by using, for instance, a laser beam that is aimed at the semiconductor surface, typically the surface of a substrate. A mark has been provided in this surface by conventional methods of photolithography, for the alignment mark to provide dependable alignment capabilities the mark must be deep enough (that is have a sufficiently high step between the bottom of the mark and the surrounding surface) while the surface on which the optical beam impacts and from which this beam is reflected must have good refractive capabilities. At the time of alignment and for alignment purposes, the optical beam is moved across the surface that contains the alignment mark, the light that is reflected by the surface is captured and observed. The pattern or behavior of the reflected light indicates where the impacting light beam is with respect to the alignment mark and can therefore be used to locate the alignment mark and, finally, to align the wafer within the wafer stepper tool.

The invention addresses the aspect of wafer alignment where, for a stepper and scanner tool, an alignment mark is created by using a special alignment mask. This requires that the special mask be loaded onto the reticle stack after which the alignment mark is printed. This process therefore requires a special alignment mask while this mask, before the alignment mark can be printed, must be aligned in the reticle stack. This latter step is a time consuming process, which traditionally results in a negative cost impact on the manufacturing of the semiconductor devices and is therefore to be avoided. The invention provides a method whereby a (zero-layer or containing no layer pattern) reticle containing an alignment mark is mounted directly on the reticle stack. The optical scanner can now print the alignment mark directly, eliminating time-consuming operations of mounting a special alignment mark mask and aligning the reticle for the special alignment mark.

U.S. Pat No. 6,083,650 (Ogusu et al.) shows a method for forming alignment marks by using a reticle.

U.S. Pat. No. 5,902,452 (Chen et al.) shows a method to form alignment marks using a dry etch.

U.S. Pat. No. 5,837,404 (Lu) discloses a method for forming the zero layer mask.

U.S. Pat. No. 5,893,744 (Wang) shows a method for forming the zero layer mark for alignment.

SUMMARY OF THE INVENTION

A principle objective of the invention is to simplify the process of using alignment marks.

Yet another objective of the invention is to remove the need for a conventional reticle in order to create alignment marks.

A still further objective of the invention is to provide a zero-layer reticle that is mounted directly on the reticle stage.

In accordance with the objectives of the invention a new method is provided for the use of alignment marks. In prior art methods, a combination mask is mounted in a mask holder. The combination mask contains multiple, different alignment marks for different purposes and steps in a semiconductor processing sequence. This mark is printed onto the surface of a wafer. Using the method of the invention, a reticle is used that does not contain any patterns (a zero-layer reticle), on this zero-layer reticle an alignment mark is created. This zero-layer alignment mark is referred to as the zero-mark alignment mark, this alignment mark can be printed directly onto the wafer surface. Under the invention, the zero-layer reticle takes the place of the prior art mask holder, on the zero-layer reticle an alignment mark is created that can be directly printed from the zero-layer reticle onto the surface of a wafer. The zero-layer reticle further contains a multiplicity of production alignment marks in a location that is fixed with respect to the alignment mark. The location of the alignment marks therefore corresponds to a location of each alignment mark that belongs to the multiplicity of production alignment marks.

BRIEF DESCRIPTION OF THE DRAWINGS

FIG. 1 shows an example of prior art combined and multiple purpose alignment mark mask.

FIG. 2 shows a top view of the location of an alignment-mark mask of the prior art on the surface of the mask holder.

FIG. 3 shows the positioning of the alignment mark using the zero-layer reticle of the invention.

DESCRIPTION OF THE PREFERRED EMBODIMENTS

Referring now specifically to FIG. 1, there is shown a top view of a current alignment mark (AM) mask 12 with various patterns "a" through "e" that are used at different times and for different purposes of alignment in a semiconductor manufacturing facility. Each of the marks "a" through "e" has a special meaning and a special application, each mark representing a particular processing station or a particular pattern or a particular exposure within a semiconductor processing cycle. This mask must, at the time of its use, be mounted into the reticle position or location (within the exposure system) after which a particular alignment mark is printed in the surface of a substrate. This therefore requires the step of mounting the combination mask and further assuring that the alignment between the mounted combination mask and the wafer onto which an alignment mark is to be printed are in alignment.

FIG. 2 shows a top view of the current AM holder 10 and the relative position within the current holder of the AM mask 12. The mask 10 is essentially located in the geometric center of the AM holder 12.

FIG. 3 shows a top view of the new AM holder 14 of the invention whereby an opening 16 has been created in the geometric center of the holder 14 while further an AM mask 18 has been created as a new entity that is to be used for alignment purposes. The opening 16 is used to mount conventional AM's as shown in FIG. 1, by simultaneously printing the new alignment mark 18 and the conventional alignment mark as contained in the conventional AM mask (that is mounted in opening 16), the new alignment mark can be printed onto the underlying surface at the same time that the conventional alignment mark can be printed. The new alignment mark 18 now provides, after this alignment mark has been imprinted on the surface of a wafer, a new and additional point of reference. This additional alignment mark is referred to as the zero-reference alignment mark. The two functions of using a specific alignment mask in addition to using the general alignment mark mask (FIG. 1) has been combined by making the zero-reference alignment mark part of and being contained in the AM holder that contains the general alignment mark mask.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for using alignment marks in a stepper and scanner tool, comprising the steps of:

providing a stepper and scanner tool;

providing a semiconductor substrate, whereby said substrate is a bare semiconductor substrate that has as yet not been subjected to any semiconductor processing steps;

providing a zero-layer reticle, said zero-layer reticle comprising a first alignment mark in addition to comprising multiple second alignment marks, a location of said first alignment mark with respect to said multiple second alignment marks being fixed;

positioning said semiconductor substrate within said stepper and scanner tool;

positioning said zero-layer reticle in a reticle position within said stepper and scanner tool; and printing said first alignment mark on the surface of said substrate, assuring that each of said second alignment marks is printed on the surface of said substrate by using said first alignment mark as an alignment mark.

2. A method of manufacturing an element with an alignment pattern by use of a process of photolithography, comprising the steps of:

preparing a mask comprising a first alignment mark in addition to comprising a multiple second alignment marks, said first alignment mark being a reference alignment mark with said reference being a reference of location of said first alignment mark with respect to each of said multiple second alignment; and exposing a substrate by using said first alignment mark and at least one of said multiple second alignment marks.

3. The method of claim 2 wherein said element is an optical element.

4. The method of claim 3 wherein said optical element is a diffractive optical element.

5. The method of claim 4 wherein said diffractive optical element is a binary optical element.

6. The method of claim 2 wherein said exposing a substrate is printing said first alignment mark on the surface of said substrate thereby assuring that each of said second alignment marks that of said multiple production second alignment marks is printed on the surface of said substrate by using said first alignment mark as an alignment mark.

7. A method of fabricating a universal zero layer photomask of an integrated circuit, said method comprising the steps of:

provided a transparent photomask having a plurality of corners, each corner being formed by two intersecting edges; and forming two opaque regions comprising a first alignment mark and multiple second alignment marks, said first alignment mark being a reference alignment mark with said reference being a reference of location of said first alignment mark with respect to each of said multiple second alignment marks.

8. The method of claim 7 wherein said transparent photomask is made of a material selected from a group comprising quartz and glass.

* * * * *